(12) United States Patent
Song et al.

(10) Patent No.: US 12,174,503 B2
(45) Date of Patent: Dec. 24, 2024

(54) DISPLAY PANEL AND MANUFACTURING METHOD THEREOF

(71) Applicant: WUHAN CHINA STAR OPTOELECTRONICS TECHNOLOGY CO., LTD., Wuhan (CN)

(72) Inventors: Jiyue Song, Wuhan (CN); Fei Ai, Wuhan (CN)

( * ) Notice: Subject to any disclaimer, the term of this patent is extended or adjusted under 35 U.S.C. 154(b) by 0 days.

(21) Appl. No.: 17/771,508

(22) PCT Filed: Apr. 19, 2022

(86) PCT No.: PCT/CN2022/087682
§ 371 (c)(1),
(2) Date: Apr. 25, 2022

(87) PCT Pub. No.: WO2023/193295
PCT Pub. Date: Oct. 12, 2023

(65) Prior Publication Data
US 2024/0142837 A1 May 2, 2024

(30) Foreign Application Priority Data
Apr. 8, 2022 (CN) .......................... 202210369830.6

(51) Int. Cl.
*G02F 1/1368* (2006.01)
*G02F 1/133* (2006.01)
*H01L 27/12* (2006.01)

(52) U.S. Cl.
CPC ........ *G02F 1/1368* (2013.01); *G02F 1/13318* (2013.01); *H01L 27/1225* (2013.01); *H01L 27/127* (2013.01)

(58) Field of Classification Search
CPC ..................................................... G02F 1/1368
See application file for complete search history.

(56) References Cited

U.S. PATENT DOCUMENTS

2005/0116250 A1* 6/2005 Mizuguchi ........ H01L 27/14687
257/140
2005/0218409 A1* 10/2005 Um ........................ H10K 50/85
257/E27.111
(Continued)

FOREIGN PATENT DOCUMENTS

| CN | 1870296 A | 11/2006 |
| CN | 101996997 A | 3/2011 |

(Continued)

OTHER PUBLICATIONS

International Search Report in International application No. PCT/CN2022/087682, mailed on Dec. 21, 2022.
(Continued)

*Primary Examiner* — Sang V Nguyen (57) ABSTRACT

A display panel is disclosed. The display panel includes a photosensitive device. The photosensitive device includes a barrier component and a second active pattern. The second active pattern includes a second lightly-doped part, a second intrinsic part surrounding the second lightly-doped part, and a second heavily-doped part surrounding the second intrinsic part. In a film thickness direction, the barrier component overlaps the second intrinsic part. A dark current of the photosensitive device is reduced by the second intrinsic part, thereby improving sensitivity.

15 Claims, 5 Drawing Sheets

(56) References Cited

U.S. PATENT DOCUMENTS

| | | | | |
|---|---|---|---|---|
| 2006/0262239 A1* | 11/2006 | Oana | ................ | H01L 29/41733 |
| | | | | 257/E27.111 |
| 2009/0278121 A1* | 11/2009 | Kakkad | ................ | H01L 31/147 |
| | | | | 257/E33.044 |
| 2010/0019252 A1* | 1/2010 | Bratkovski | ............ | H01L 33/18 |
| | | | | 977/950 |
| 2018/0074355 A1* | 3/2018 | Cheng | ................ | G02F 1/13394 |
| 2023/0154949 A1* | 5/2023 | Tang | ................ | H01L 27/14612 |
| | | | | 250/208.1 |

FOREIGN PATENT DOCUMENTS

| | | | |
|---|---|---|---|
| CN | 104916584 | A | 9/2015 |
| CN | 106326845 | A | 1/2017 |
| CN | 107819018 | A | 3/2018 |
| CN | 108710237 | A | 10/2018 |
| CN | 109993156 | A | 7/2019 |
| CN | 110010672 | A | 7/2019 |
| CN | 112928134 | A | 6/2021 |
| CN | 113488507 | A | 10/2021 |
| JP | 2007194547 | A | 8/2007 |

OTHER PUBLICATIONS

Written Opinion of the International Search Authority in International application No. PCT/CN2022/087682, mailed on Dec. 21, 2022.

Chinese Office Action issued in corresponding Chinese Patent Application No. 202210369830.6 dated Apr. 22, 2024, pp. 1-6.

\* cited by examiner

DISPLAY PANEL AND MANUFACTURING METHOD THEREOF

FIELD

The present disclosure relates to a field of light-sensing display technologies, and more particularly, to a display panel and a manufacturing method thereof.

BACKGROUND

Photoelectric sensors are widely used in many fields such as non-contact measurement, fingerprint recognition, ambient light detection, and communication. With rapid development of panel industry, people demand display panels having higher resolution, wider viewing angles, and lower consumption. In addition, people require display panels to have diverse functions and human-computer interaction. Currently, improving competitiveness of display panels is one of a development trend. An ambient light detection function can automatically adjust brightness of panels according to brightness of an external environment. Also, when taking pictures, the ambient light detection function can automatically turn on a flash or fill light according to an external environment. Conventional ambient photosensitive devices are basically external, inevitably increasing manufacturing cost. Therefore, panel manufacturers and terminal manufacturers focus on using fewer photomasks to integrate ambient photosensitive devices into array substrates, thereby reducing cost of the ambient photosensitive devices.

Thus, it is difficult to integrate ambient photosensitive devices into conventional display panels at low cost.

Regarding the Technical Issue it is difficult to integrate ambient photosensitive devices into conventional display panels at low cost.

SUMMARY

Embodiments of the present disclosure provide a display panel and a manufacturing method thereof to alleviate technical issues of conventional luminescent devices having a short lifespan and poor luminescent efficiency.

An embodiment of the present disclosure provides a display panel, comprising an array substrate, wherein the array substrate comprises:
a base;
a thin-film transistor (TFT) device;
a photosensitive device, wherein the photosensitive device comprises a first electrode, a second electrode, a second active pattern, a connector electrode, a barrier component, the second active pattern comprises a second intrinsic part, a second heavily-doped part, a second lightly-doped part, the second electrode is electrically connected to the second heavily-doped part, the first electrode is electrically connected to the second lightly-doped part by the connector electrode, and the connector electrode is in contact with the second lightly-doped part;
wherein an orthographic projection of the barrier component on the base overlaps an orthographic projection of the second intrinsic part on the base, the second lightly-doped part is surrounded by the second intrinsic part, and the second intrinsic part is surrounded by the second heavily-doped part.

Optionally, in some embodiments of the present disclosure, display panel comprises an interlayer insulating layer, a planarization layer, and a passivation layer, the interlayer insulating layer is disposed on the base, the planarization insulating layer is disposed on the interlayer insulating layer, the passivation layer is disposed on the planarization layer, and the second electrode is connected to the second heavily-doped part by a first through-hole.

Optionally, in some embodiments of the present disclosure, the connector electrode includes a first part disposed in a second through-hole, a second part disposed in a third through-hole, and a third part connecting the first part with the second part, the first part is connected to the second lightly-doped part, the second part is connected to the first electrode, and the first part and the second part are disposed along a film thickness direction of the display panel.

Optionally, in some embodiments of the present disclosure, the first electrode, the second electrode, the connector electrode, and the second active pattern constitute a vertical heterojunction structure.

Optionally, in some embodiments of the present disclosure, a contact area between the connector electrode and the second lightly-doped part is less than an area of a surface of the second lightly-doped part facing the connector electrode.

Optionally, in some embodiments of the present disclosure, a ratio of an area of a bottom surface of the second through-hole to an area of an upper surface of the second lightly-doped part range from 0.85:1 to 1:1.

Optionally, in some embodiments of the present disclosure, the contact area is a light-receiving surface of the vertical heterojunction structure.

Optionally, in some embodiments of the present disclosure, the barrier component has a ring-shaped structure.

Optionally, in some embodiments of the present disclosure, the TFT device comprises a first active pattern, a gate, a source, and a drain disposed above the base, the gate is disposed on the first active pattern, the source and the drain are disposed on the gate, the first active pattern comprises a first intrinsic part, a first heavily-doped part, and a first lightly-doped part, the first intrinsic part is surrounded by the first lightly-doped part, the first lightly-doped part is surrounded by the first heavily-doped part, and the first active pattern and the second active pattern are disposed on a same layer.

Optionally, in some embodiments of the present disclosure, material of the first active pattern and material of the second active pattern are a same.

Optionally, in some embodiments of the present disclosure, the barrier component and the gate are disposed on a same layer.

Optionally, in some embodiments of the present disclosure, material of the barrier component and material of the gate are a same.

Optionally, in some embodiments of the present disclosure, the second electrode, the first electrode, the source, and the drain area disposed on a same layer.

Optionally, in some embodiments of the present disclosure, the display panel comprises a third electrode disposed on the passivation layer, the third electrode is connected to the source, and the connector electrode and the third electrode are disposed on a same layer.

Optionally, in some embodiments of the present disclosure, the third electrode is an anode, and material of the connector electrode and material of the anode are at least one of Cu, Ag, Li, Yb, Mg, Al, In, indium tin oxide (ITO), indium zinc oxide (IZO), or azo.

Optionally, in some embodiments of the present disclosure, the display panel comprises a fourth electrode, the fourth electrode is disposed on the planarization layer, and the connector electrode and the fourth electrode are disposed on a same layer.

Optionally, in some embodiments of the present disclosure, the fourth electrode is an anode, and material of the connector electrode and material of the anode are at least one of Cu, Ag, Li, Yb, Mg, Al, In, indium tin oxide (ITO), indium zinc oxide (IZO), or azo.

An embodiment of the present disclosure provides a method of manufacturing a display panel, comprising following steps:
providing a base;
forming an active layer on the base, wherein the active layer comprises a first active pattern and a second active pattern;
forming a gate insulating layer, a gate layer, and an interlayer insulating layer on the active layer, the gate layer comprises a gate and a barrier component, the gate corresponds to the first active pattern, and the barrier component corresponds to the second active pattern;
forming a source, a drain, a first electrode, and a second electrode on the interlayer insulating layer, and forming a source; and
forming a planarization layer and a connector electrode on the source and the drain, wherein the source, the drain, and the gate constitute a thin-film transistor (TFT) device, and the first electrode, the second electrode, the connector electrode, and the second active pattern constitute a photosensitive device.

Optionally, in some embodiments of the present disclosure, in the step of forming the source, the drain, the first electrode, and the second electrode, the method comprises a following step:
forming a source/drain layer on the interlayer insulating layer, wherein the source/drain layer comprises the source, the drain, the first electrode, and the second electrode which are disposed on a same layer.

Optionally, in some embodiments of the present disclosure, in the step of manufacturing the gate layer, the method comprises a following step:
forming the gate layer on the base, wherein the gate layer comprises the gate and the barrier component which are disposed on a same layer, the gate corresponds to the first active pattern, the barrier component corresponds to the second active pattern, and the barrier component has a ring-shaped structure.

Regarding the Beneficial Effect

A barrier component is disposed in a photosensitive device. An orthographic projection of the barrier component on a base overlaps an orthographic projection of a second intrinsic part on the base. A second active pattern includes a second lightly-doped part, a second intrinsic part, and a second heavily-doped part. The second lightly-doped is surrounded by the second intrinsic part. The second intrinsic part is surrounded by the second heavily-doped part. A dark current of a photosensitive device is reduced by the second intrinsic part, thereby improving sensitivity.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

REFERENCE NUMBERS OF DRAWINGS

| reference number | element | reference number | element |
| --- | --- | --- | --- |
| 10 | base | 20 | light-shielding layer |
| 30 | buffer layer | 40 | active layer |
| 50 | gate insulating layer | 70 | interlayer insulating layer |
| 90 | planarization layer | 100 | fourth electrode |
| 110 | passivation layer | 120 | third electrode |
| 130 | connector electrode | 401 | first active pattern |
| 402 | second active pattern | 4011 | first intrinsic part |
| 4012 | first heavily-doped part | 4013 | first lightly-doped part |
| 4021 | second intrinsic part | 4022 | second heavily-doped part |
| 4023 | first lightly-doped part | 801 | source |
| 802 | drain | 803 | second electrode |
| 804 | first electrode | 601 | gate |
| 602 | barrier component | H1 | first through-hole |
| H2 | second through-hole | H3 | third through-hole |
| 1 | TFT device | 2 | photosensitive device |

DETAILED DESCRIPTION

Hereinafter preferred embodiments of the present disclosure will be described with reference to the accompanying drawings to exemplify the embodiments of the present disclosure can be implemented, which can fully describe the technical contents of the present disclosure to make the technical content of the present disclosure clearer and easy to understand. However, the described embodiments are only some of the embodiments of the present disclosure, but not all of the embodiments. All other embodiments obtained by those skilled in the art based on the embodiments of the present disclosure without creative efforts are within the scope of the present disclosure. Other embodiments, which are based on the embodiments of the present disclosure, obtained by those skilled in the art without making any inventive efforts are within the scope of protection defined by the present disclosure. It should be noted that described embodiments are merely used to construct the present disclosure and are not intended to limit the present disclosure. In the present disclosure, unless further description is made, terms such as "top" and "bottom" usually refer to a top of a device and a bottom of a device in an actual process or working status, and specifically, to the orientation as shown in the drawings. Terms such as "inside" and "outside" are based on an outline of a device.

In conventional display panels, ambient photosensitive devices are attached to an exterior of the display panels, increasing manufacturing cost. Therefore, panel manufacturers and terminal manufacturers focus on using fewer photomasks to integrate ambient photosensitive devices into array substrates, thereby reducing cost of the ambient photosensitive devices.

Thus, it is necessary to provide a display panel which requires less photomasks in a manufacturing process, thereby reducing cost of the display panel. Also, a photosensitive device is integrated into the display panel.

Figure 1:
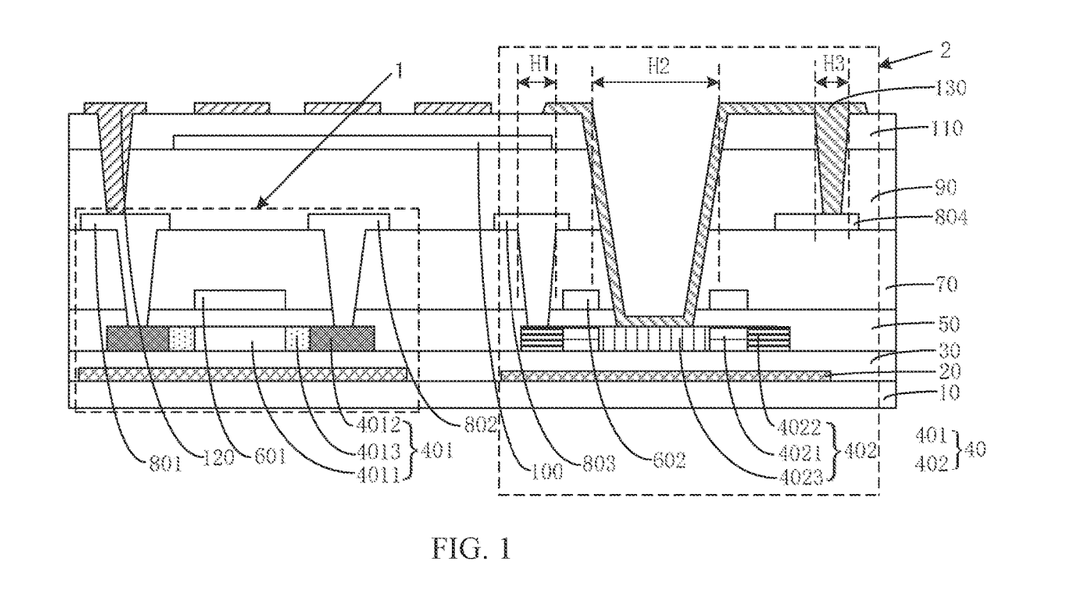
FIG. 1 is a schematic cross-sectional view showing a display panel provided by an embodiment of the present disclosure.

As shown in FIG. 1, a display panel provided by the present disclosure comprises a base 10, and a thin-film transistor (TFT) device 1 and a photosensitive device 2 which are disposed on the base 10. The TFT device 1 comprises a first active pattern 401, a gate 601, a source 801, and a drain 802 which are disposed on the base 10. The first active pattern 401 includes a first intrinsic part 4011, a first heavily-doped part 4012, and a first lightly-doped part 4013. The photosensitive device 2 includes a first electrode 804, a second electrode 803, a second active pattern 402, and a connector electrode 130. The second active pattern 402 includes a second intrinsic part 4021, a second heavily-doped part 4022, and a second lightly-doped part 4023. The second electrode 803 is electrically connected to the second heavily-doped part 4022. The first electrode 804 is electrically connected to the second lightly-doped part 4023. The first active pattern 401 and the second active pattern 402 are disposed on a same layer.

In the present disclosure, the second active pattern 402 of the photosensitive device 2 and the first active pattern 401 of the TFT device 1 are disposed on a same layer. Therefore, a number of photomasks required for integrating the photosensitive device 2 in the display panel is reduced, thereby reducing cost.

The barrier component 602, the first electrode 804, the second electrode 803, and the connector electrode 130 of the photosensitive device 2 and conventional layers of the TFT device 1 can be manufactured with a same photomask. The second active pattern 402 and the first active pattern 401 can be disposed on a same layer. The barrier component 602 and the gate 601 can be disposed on a same layer. The first electrode 804, the second electrode 803, the source 801, and the drain 802 can be disposed on a same layer. Therefore, the photosensitive device 2 can be integrated into the display panel without using an additional photomask.

The photosensitive device 2 may be a light sensor configured to receive a photo signal. The photosensitive device 2 can be applied to non-contact measurement, fingerprint recognition, ambient light detection, and communication. The photosensitive device 2 diversifies functions of the display panel, which realizes human-computer interaction and improves competitiveness of the display panel.

Technical solutions of the present disclosure are described below in conjunction with specific embodiments.

The display panel of the present disclosure can be an organic light-emitting diode (OLED) display panel or a liquid crystal display (LCD) panel. In following description, a fringe-field switching (FFS) display panel is taken as an example.

In one embodiment, the first electrode 804, the second electrode 803, the connector electrode 130, and the second active pattern 402 constitute a vertical heterojunction structure.

The connector electrode comprises a first part disposed in a second through-hole H2, a second part disposed on a third through-hole H3, and a third part connecting the first part with the second part. The first part is connected to the second lightly-doped part 4023. The second part is connected to the first electrode 804. The first part and the second part are disposed along a film thickness direction.

In one embodiment, a contact surface is a light-receiving surface of the vertical heterojunction structure. An area of the contact surface is less than an area of a surface of the second lightly-doped part 4023 facing the connector electrode 130.

In one embodiment, the display panel may also be an OLED display panel. The OLED display panel includes a base 10, an array layer, a planarization layer 90, and an anode and a cathode disposed on the planarization layer 90.

The connector electrode 130, the anode, and the cathode may be disposed on a same layer.

It should be understood that the connector electrode 130 and any one of a plurality of electrodes can share a same photomask. Therefore, the connector electrode 130 can be manufactured without using an additional photomask. As such, cost is reduced.

Figure 2:
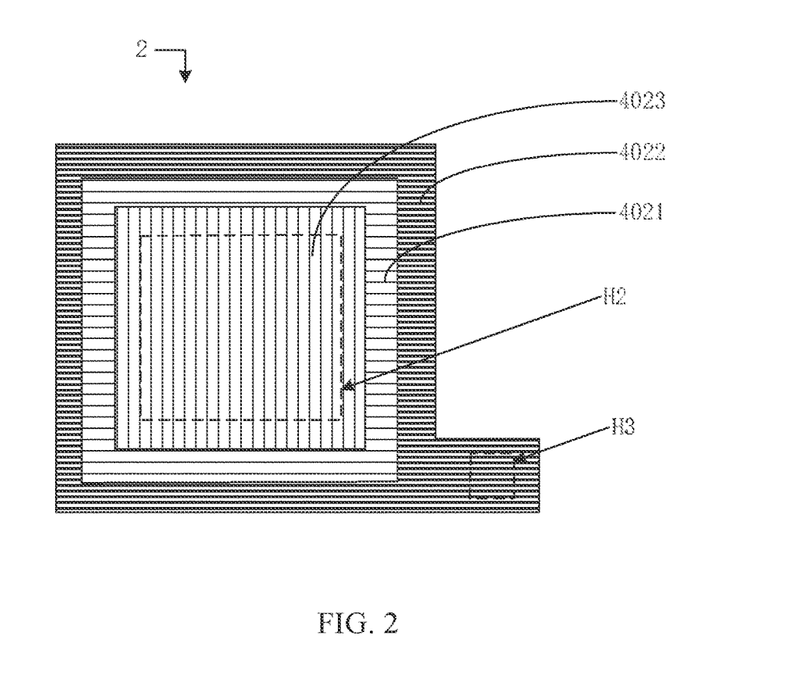
FIG. 2 is a schematic top view showing a photosensitive device disposed in the display panel provided by the embodiment of the present disclosure.

Please refer to FIG. 1 and FIG. 2. In some embodiments, the display panel may also be an FSS-LCD panel. The FSS-LCD panel comprises an array substrate. The array substrate comprises a base 10, a light-shielding layer 20, a buffer layer 30, an active layer 40, a gate insulating layer 50, a gate layer, an interlayer insulating layer 70, a source/drain layer, a planarization layer 90, a fourth electrode layer 100, a passivation layer 110, and a third electrode layer.

The active layer 40 includes a first active pattern 401 and a second active pattern 402. The second active pattern 402 is taken as an example for description. The active pattern 402 is located in the photosensitive device 2. The second active pattern 402 includes a second intrinsic part 4021, a second heavily-doped part 4022, and a second lightly-doped part 4023. The second intrinsic part 4021 is a semiconductor. The second heavily-doped part 4022 is a conductor. Electrical resistance of the second intrinsic part 4021 is greater than electrical resistance of the second lightly-doped part 4023, and is greater than electrical resistance of the second heavily-doped part 4022. As such, a barrier component 602 can block phosphorus ions from being lightly doped. The barrier component 602 corresponds to the second intrinsic part 4021, thereby increasing entire electrical resistance of the second active pattern 402, reducing a dark current of the photosensitive device 2, and improving detection sensitivity. The first active pattern 401 is similar to the second active pattern 402, and is not described here again.

It should be understood that an occupancy rate of the second intrinsic part 4021 in the second active pattern 402 can be controlled by controlling a block area of the barrier component 602, thereby further reducing a dark current of the photosensitive device 2, and improving detection sensitivity.

The gate layer may include a gate 601 and the barrier component 602 which are disposed on a same layer.

The source/drain layer may include a source 801, a drain 802, a first electrode 804, and a second electrode 803 which are disposed on a same layer.

The fourth electrode layer 100 may include a fourth electrode 100 and the connector electrode 130 which are disposed on a same layer. Alternatively, the third electrode layer may include a third electrode 120 and the connector electrode 130 which are disposed on a same layer.

In one embodiment, a thickness of the light-shielding layer 20 rages from 500 Å to 5000 Å.

Material of the light-shielding layer 20 may be at least one of Mo, Al, Cu, Ti, or an alloy including thereof.

In one embodiment, a thickness of the buffer layer 30 ranges from 1000 Å to 5000 Å.

The buffer layer 30 has a single layer of SiOx, a single layer of SiNx, or a stacked layer of SiNx and SiOx.

In one embodiment, material of the active layer includes polysilicon.

In one embodiment, the gate insulating layer has a single layer of SiOx, a single layer of SiNx, or a stacked layer of SiNx and SiOx, and a thickness of the gate insulating layer ranges from 1000 Å to 5000 Å.

In one embodiment, material of the interlayer insulating layer 70 includes at least one of SiOx, SiNx, SiON, or a metal oxide.

The interlayer insulating layer 70 may have a stacked layer of SiNx and SiOx.

In one embodiment, material of the source/drain layer includes at least one of Mo, Ti, Al, Cu, Ag, or an alloy including thereof.

In one embodiment, the second electrode 803 is connected to the second heavily-doped part 4022 by a first through-hole H1. The first electrode 804 is connected to the connector electrode 130 by the second through-hole H2. The connector electrode 130 is connected to the second lightly-doped part 4023 by the third through-hole H3. The second electrode 803, the first electrode 804, the source 801, and the drain 802 are disposed on a same layer.

The first electrode 804, the second electrode 803, the connector electrode 130, and the second active pattern 402 constitute a vertical heterojunction structure, thereby improving flexibility for designing an area of the vertical heterojunction structure.

It should be understood that an area of a light-receiving surface of the photosensitive device 2 can be freely adjusted. The area of the light-receiving surface of the photosensitive device 2 and a contact area between the connector electrode 130 and the second lightly-doped part 4023 can be equal. By adjusting a surface area of the second lightly-doped part 4023, a maximum area of the light-receiving surface can be adjusted. Therefore, the area of the light-receiving surface can be adjusted.

In one embodiment, the display panel further comprises the third electrode 120 disposed on the TFT device 1. The third electrode 120 is connected to the source 801 and the drain 802. The connector electrode 130 and the third electrode 120 are disposed on a same layer.

In one embodiment, the second lightly-doped part 4023 is surrounded by the second intrinsic part 4021. The second intrinsic part 4021 is surrounded by the second heavily-doped part 4022. The barrier component 602 is disposed on the second intrinsic part 4021. The barrier component 602 and the gate 601 are disposed on a same layer.

The barrier component 602 may have a ring-shaped structure.

It should be understood that phosphorus ions are blocked from being lightly doped by the barrier component 602. The second intrinsic part 4021 is correspondingly formed below the barrier component 602. Electrical resistance of the second intrinsic part 4021 is greater than electrical resistance of the second lightly-doped part and electrical resistance of the second heavily-doped part. Therefore, a dark current of a device can be reduced, and detection sensitivity can be improved.

In one embodiment, the barrier component 602 has a ring-shaped structure. An orthographic projection of the barrier component 602 on the base 10 overlaps an orthographic projection of the second intrinsic part 4021 on the base 10.

The barrier component 602 corresponds to the second intrinsic part 4021.

In one embodiment, a contact surface the connector electrode 130 is in contact with the second lightly-doped part 4023. An area of the contact surface is less than an area of a surface of the second lightly-doped part 4023 facing the connector electrode 130.

In one embodiment, material of the first active pattern 401 and material of the second active pattern 402 are a same.

In one embodiment, material of the barrier component 602 and material of the gate 601 are a same.

In one embodiment, material of the first electrode 804, material of the second electrode 803, material of the source 801, and material of the drain 802 are a same.

In one embodiment, material of the connector electrode 130, material of the third electrode 120, and material of the fourth electrode 100 are a same.

Material of the connector electrode 130, material of the third electrode 120, and material of the fourth electrode 100 are at least one of Cu, Ag, Li, Yb, Mg, Al, In, indium tin oxide (ITO), indium zinc oxide (IZO), or azo.

Figure 3:
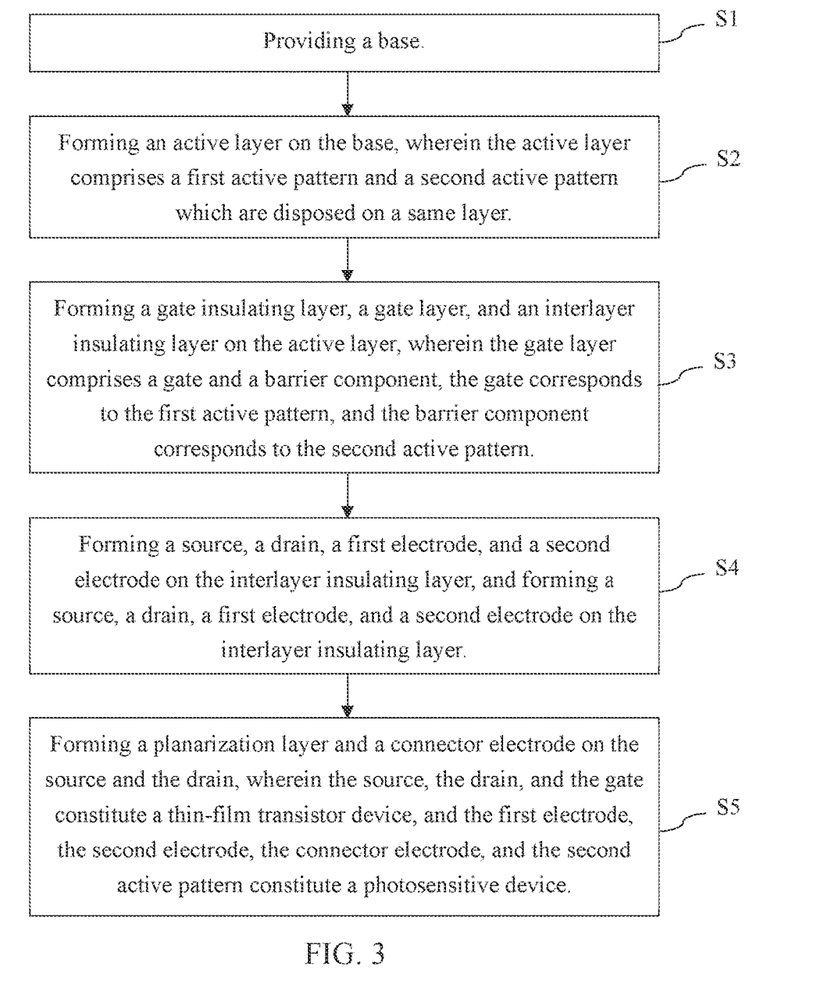
FIG. 3 is a schematic flowchart showing a method of manufacturing a display panel provided by an embodiment of the present disclosure.

Please refer to FIG. 3. An embodiment of the present disclosure provides a method of manufacturing a display panel, including following steps:

S1, providing a base 10;

S2, forming an active layer 40 on the base 10, wherein the active layer 10 comprises a first active pattern 401 and a second active pattern 402 which are disposed on a same layer;

S3, forming a gate insulating layer 50, a gate layer, and an interlayer insulating layer 70 on the active layer 40. The gate layer comprises a gate 601 and a barrier component 602. The gate 601 corresponds to the first active pattern 401. The barrier component 602 corresponds to the second active pattern 402;

S4, forming a source 801, a drain 802, a first electrode 804, and a second electrode 803 on the interlayer insulating layer 70; and S5, forming a planarization layer 90 and a connector electrode 130 on the source and the drain, wherein the source 801, the drain 802, and the gate 601 constitute a thin-film transistor (TFT) device 1, and the first electrode 804, the second electrode 803, the connector electrode 130, and the second active pattern 402 constitute a photosensitive device 2.

In some embodiments, the method is used to manufacture an FSS-LCD panel. The FSS-LCD panel includes an array substrate. Please refer to FIGS. 4A to 4G, a method of manufacturing the array substrate is provided.

Figure 4A:
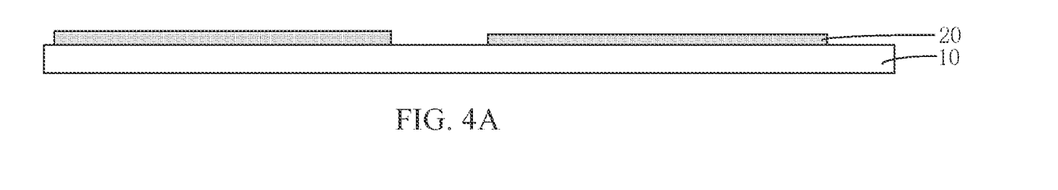
FIGS. 4A to 4G are schematic cross-sectional views showing the method of manufacturing the display panel provided by the embodiment of the present disclosure.

Specifically, please refer to FIG. 4A. In one embodiment, the base 10 is provided, and a light-shielding layer 20 is formed on the base 10.

Figure 4B:
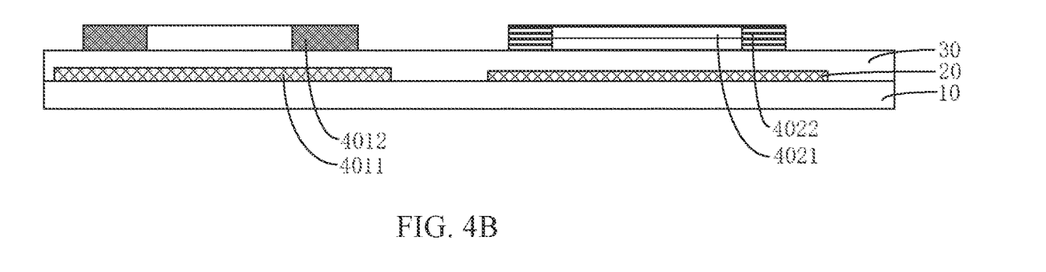

Specifically, please refer to FIG. 4B. In one embodiment, based on FIG. 4A, a buffer layer 30 is formed on the base 10 and a light-shielding layer 20. An a-Si layer is formed on the buffer layer 30. After a low-temperature polycrystalline silicon excimer laser annealing (LTPS ELA) process is conducted, a-Si is transformed into poly-Si. The active layer 40 is formed by exposure and etching. The active layer 40 includes the first active pattern 401 and the second active pattern 402. Phosphorus ions are doped into the first active pattern 401 and the second active pattern 402, thereby forming a first heavily-doped part 4012 of the first active pattern 401 and a second heavily-doped part 4022 of the second active pattern 402.

Figure 4C:
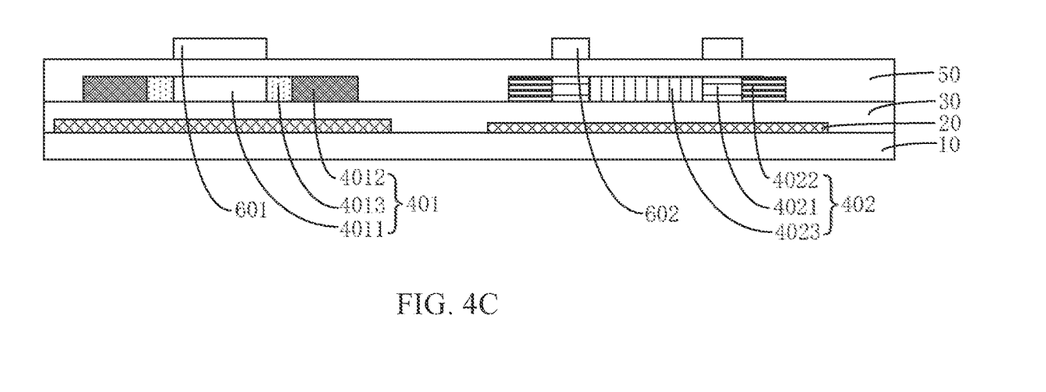

Specifically, please refer to FIG. 4C. In one embodiment, based on FIG. 4B, the gate insulating layer 50 is formed on the buffer layer 30 and the active layer 40. The gate layer is formed on the gate insulating layer 50. The gate layer includes the gate 601 and the barrier component 602. Phosphorus ions are blocked by the gate 601 and the barrier component 6012, thereby forming a first lightly-doped part 4013 of the first active pattern and a second lightly-doped prat 4023 of the second active pattern 402.

Since phosphorus ions are blocked by the ring-shaped barrier component 602, a dark current of the device is reduced, and sensitivity of the photosensitive device 2 is improved.

Figure 4D:
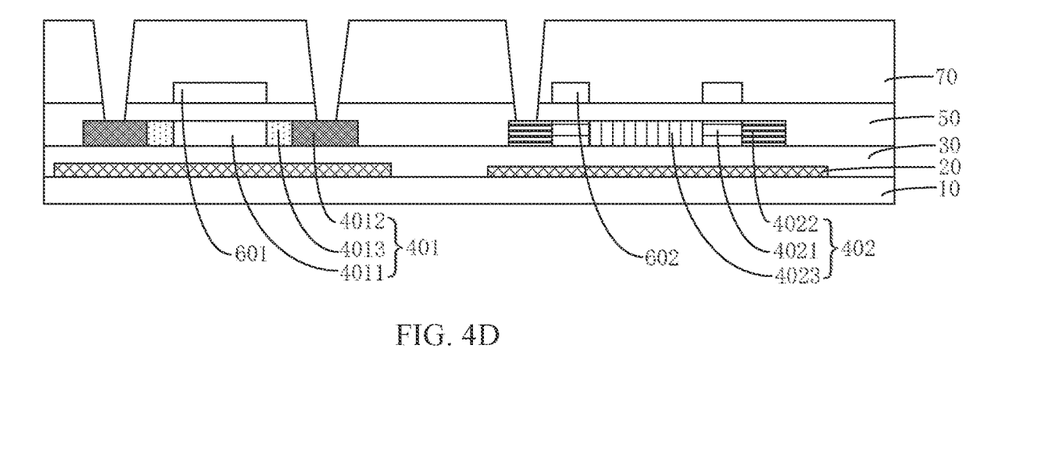

Specifically, please refer to FIG. 4D. In one embodiment, based on FIG. 4C, the interlayer insulating layer 70 is formed on the gate insulating layer 50 and the gate layer.

Specifically, please refer to FIG. 4D. In one embodiment, based on FIG. 4C, an interlayer insulating layer 70 is formed on the gate layer. A first through-hole H1 is formed by patterning the interlayer insulating layer 70.

Multiple through-holes respectively correspond to the first heavily-doped part 4012 and the second heavily-doped part 4022.

In a step of forming the first through-hole H1, the first through-hole H1 is formed by exposure and etching.

The interlayer insulating layer 70 may have a stacked layer of SiNx and SiOx.

Figure 4E:
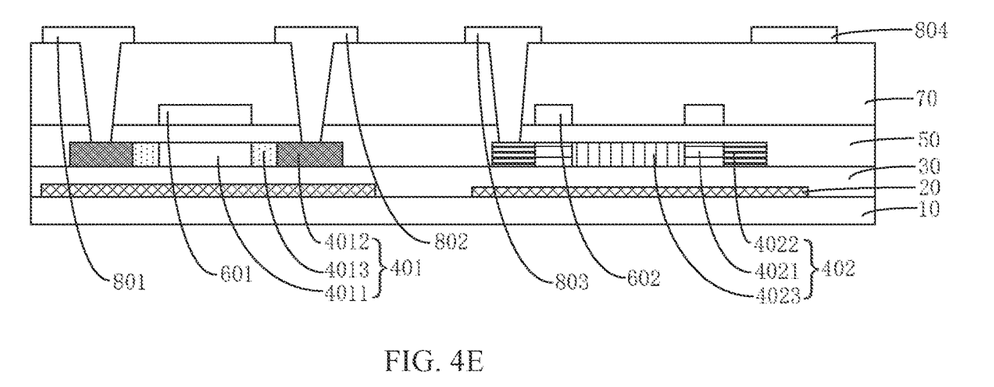

Specifically, please refer to FIG. 4E. In one embodiment, based on FIG. 4D, a source/drain layer is formed on the interlayer insulating layer 70. The source/drain layer includes the source 801, the drain 802, the first electrode 804, and the second electrode 803 which are disposed on a same layer. The source 801 and the drain 802 are respectively connected to the first heavily-doped part 4012 by a through-hole. The second electrode 803 and the second heavily-doped part 4022 are connected to each other by the first through-hole H1.

Figure 4F:
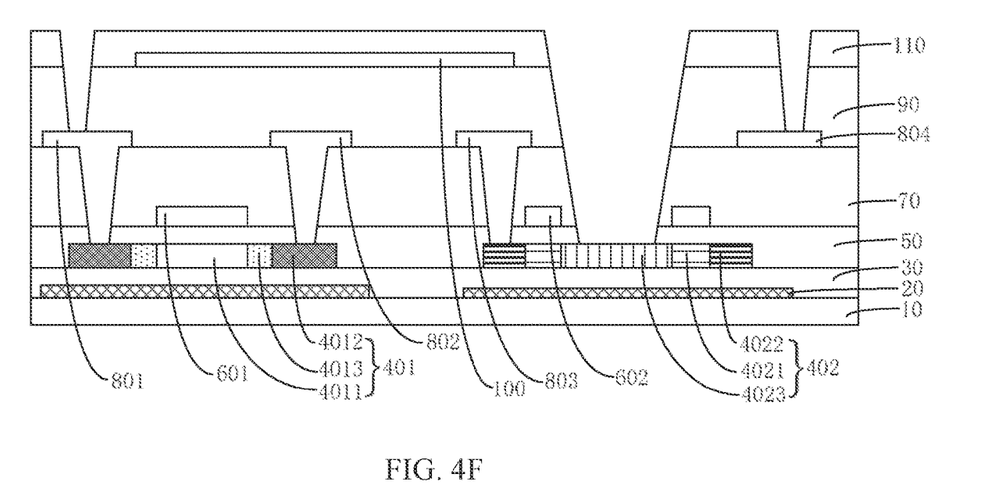

Specifically, please refer to FIG. 4F. In one embodiment, based on FIG. 4E, the planarization layer 90 is formed on the interlayer insulating layer 70 and the source/drain layer. A fourth electrode 100 is formed on the planarization layer 90. A passivation layer 110 is formed on the planarization layer 90. The planarization layer 90 and the passivation layer 110 are patterned to form a second through-hole H2 and a third through-hole H3.

An aperture of the second through-hole H2 can be appropriately adjusted according to requirements of a light-sensing area, thereby improving flexibility for designing the light-sensing area. When the required light-sensing area is relatively large, an area of a bottom surface of the second through-hole H2 is equal to or slightly less than an area of an upper surface of the second lightly-doped part 4023. A ratio of the area of the bottom surface of the second through-hole H2 to the area of the upper surface of the second lightly-doped part 4023 ranges from 0.85:1 to 1:1.

The planarization layer 90 may be made of organic material, or may be made of inorganic material such as SiNx and SiOx.

In the present embodiment, the aperture of the second through-hole H2 can be appropriately adjusted according to the required light-sensing area, thereby improving flexibility for designing the light-sensing area.

Figure 4G:
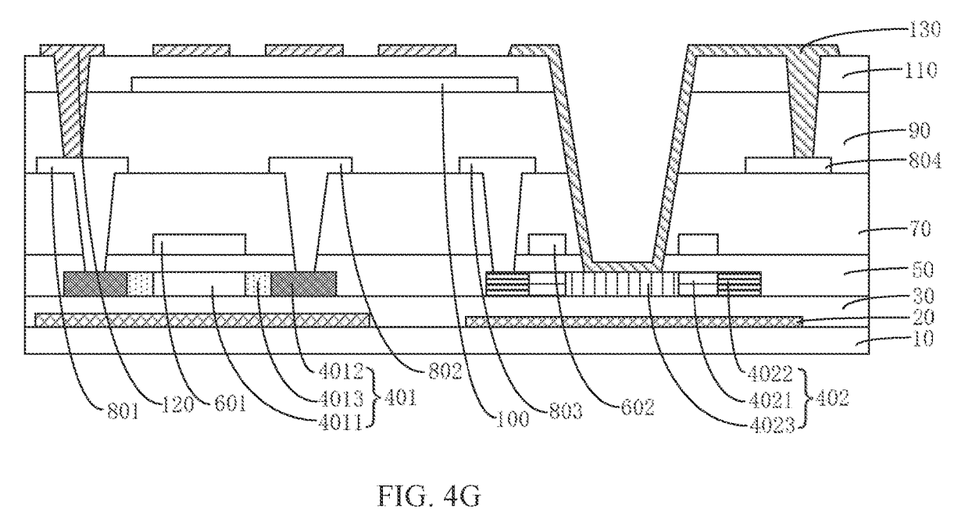

Specifically, please refer to FIG. 4G. In one embodiment, based on FIG. 4F, a third electrode layer is formed on the passivation layer 110. The third electrode layer includes a third electrode 120 and the connector electrode 130.

The connector electrode 130 is connected to the second lightly-doped part 4023 by the second through-hole H2. The connector electrode 130 is connected to the first electrode 804 by the third through-hole H3.

In one embodiment, the connector electrode 130 and a fourth electrode 100 can be formed at a same time. That is, the fourth electrode 100 and the connector electrode 130 are formed in a same photomask process.

In one embodiment, in the step of forming the gate layer, the method includes a following step: forming the gate layer on the base 10. The gate layer includes the gate 601 and the barrier component 602 which are disposed on a same layer. The gate 601 corresponds to the first active pattern 401. The barrier component 602 corresponds to the second active pattern 402. The barrier component 602 has a ring-shaped structure.

It should be understood that the barrier component 602 and the gate 601 can be formed in a same photomask process, thereby saving one photomask process. As such, a number of photomasks is reduced, and cost is reduced.

In one embodiment, in the step of forming the source 801, the drain 802, the first electrode 804, and the second electrode 803, the method further includes a following step: forming the source/drain layer on the interlayer insulating layer 70. The source/drain electrode includes the source 801, the drain 802, the first electrode 804, and the second electrode 803 which are disposed on a same layer.

It should be understood that because the first electrode 804, the second electrode 803, the source 801, and the drain 802 are formed in a same photomask process, one photomask process can be further saved. As such, the number of photomasks is reduced, and cost is reduced.

In one embodiment, the method further includes a following step: forming an electrode layer on the source/drain layer. The electrode layer includes the third electrode 120 and the connector electrode 130 which are disposed on a same layer. The third electrode 120 is connected to the source 801 and the drain 802 by a through-hole penetrating the planarization layer 90.

Preferably, it should be understood that the second active pattern 402 and the first active pattern 401 share a same photomask, the barrier component 602 and the gate 601 share a same photomask, the first electrode 804, the second electrode 803, the source 801, and the drain 802 share a same photomask, and the connector electrode 130 and the third electrode 120 or the fourth electrode 100 share a same photomask. Therefore, the photosensitive device 2 can be integrated into an array substrate or a display panel without using an additional mask. Therefore, the photosensitive device 2 can be integrated into the display panel at lower cost without using an additional mask and an additional process.

In one embodiment, the method further includes a following step: forming the first through-hole H1, the second through-hole H2, and the third through-hole H3 in the display panel. The second electrode 803 is connected to the second heavily-doped part 4022 by the first through-hole H1. The first electrode is connected to the connector electrode 130 by the second through-hole H2. The connector electrode 130 is connected to the second lightly-doped part 4023 by the third through-hole H3.

In the above description, an LTPS process is taken as an example. However, the present disclosure is not limited to the LTPS process. An a-SI process or an IGZO process can also be applied. The photosensitive device 2 is integrated into the display panel or the array substrate without using an additional photomask.

The present disclosure further provides a display device and a display module. The display module may include the above FSS display panel and a backplate, a frame sealant, an optical film, a light guide plate, and a light diffusion plate which disposed on a side of the FSS display panel. The display device also includes the above display panel, and is not described here again.

An embodiment of the present disclosure provides a display panel. The display panel comprises a base, and a TFT device and a photosensitive device disposed on the base. The TFT device includes a first active pattern, a gate, a source, and a drain disposed on the base. The first active pattern includes a first intrinsic part, and a first heavily-doped part, a first lightly-doped part. The photosensitive device includes a first electrode, a second electrode, a second active pattern, and a connector electrode. The second active pattern includes a second intrinsic part, a second heavily-doped part, and a second lightly-doped part. The second electrode is electrically connected to the second heavily-doped part. The first electrode is electrically connected to the second lightly-doped part. A barrier component is disposed in the photosensitive device. An orthographic projection of the barrier component on the base overlaps an orthographic projection of the second intrinsic part on the base. The second active pattern includes the second lightly-doped part, the second intrinsic part, and the second heavily-doped part. The second lightly-doped part is surrounded by the second intrinsic part. The second intrinsic part is surrounded by the second heavily-doped part. A dark current of the photosensitive device can be reduced by the second intrinsic part. Therefore, sensitivity of the photosensitive device can be improved.

Preferably, the first electrode and second electrode of the photosensitive device and the source and the drain of the TFT device are disposed on a same layer. The first electrode, the second electrode, the source, and the drain are formed in a same photomask process. The connector electrode of the photosensitive device and a third electrode or a fourth electrode disposed on the TFT device are disposed on a same layer. The connector electrode, the third electrode or the fourth electrode are formed in a same photomask process. The barrier component of the photosensitive device and the gate of the TFT device are disposed on a same layer. The barrier component and the gate are formed in a same photomask process. Therefore, the photosensitive device can be integrated into the display panel without using an additional photomask.

In the above embodiments, the focus of each embodiment is different, and for a part that is not detailed in an embodiment, reference may be made to related descriptions of other embodiments.

A display panel and a manufacturing method thereof have been described in detail by the above embodiments, which illustrate principles and implementations thereof. However, the description of the above embodiments is only for helping to understand the technical solution of the present disclosure and core ideas thereof, and it is understood by those skilled in the art that many changes and modifications to the described embodiments can be carried out without departing from the scope and the spirit of the disclosure that is intended to be limited only by the appended claims.

What is claimed is:

1. A display panel, comprising an array substrate; wherein the array substrate comprises:
   a base;
   a thin-film transistor (TFT) device;
   a photosensitive device, wherein the photosensitive device comprises a first electrode, a second electrode, a second active pattern, a connector electrode, a barrier component, the second active pattern comprises a second intrinsic part, a second heavily-doped part, a second lightly-doped part, the second electrode is electrically connected to the second heavily-doped part, the first electrode is electrically connected to the second lightly-doped part by the connector electrode, and the connector electrode is in contact with the second lightly-doped part to form a contact surface, the contact surface is a light-receiving surface of the photosensitive device;
   wherein an orthographic projection of the barrier component on the base overlaps an orthographic projection of the second intrinsic part on the base, the second lightly-doped part is surrounded by the second intrinsic part, and the second intrinsic part is surrounded by the second heavily-doped part;
   wherein an area of the contact surface is equal to an area of a surface of the second lightly-doped part facing the connector electrode.

2. The display panel of claim 1, wherein the display panel comprises an interlayer insulating layer, a planarization layer, and a passivation layer, the interlayer insulating layer is disposed on the base, the planarization insulating layer is disposed on the interlayer insulating layer, the passivation layer is disposed on the planarization layer, and the second electrode is connected to the second heavily-doped part by a first through-hole.

3. The display panel of claim 2, wherein the connector electrode includes a first part disposed in a second through-hole, a second part disposed in a third through-hole, and a third part connecting the first part with the second part, the first part is connected to the second lightly-doped part, the second part is connected to the first electrode, and the first part and the second part are disposed along a film thickness direction of the display panel.

4. The display panel of claim 3, wherein the first electrode, the second electrode, the connector electrode, the second active pattern constitute a vertical heterojunction structure.

5. The display panel of claim 1, wherein a ratio of an area of a bottom surface of the second through-hole to an area of an upper surface of the second lightly-doped part range from 0.85:1 to 1:1.

6. The display panel of claim 3, wherein the barrier component has a ring-shaped structure.

7. The display panel of claim 6, wherein the TFT device comprises a first active pattern, a gate, a source, and a drain disposed above the base, the gate is disposed on the first active pattern, the source and the drain are disposed on the gate, the first active pattern comprises a first intrinsic part, a first heavily-doped part, and a first lightly-doped part, the first intrinsic part is surrounded by the first lightly-doped part, the first lightly-doped part is surrounded by the first heavily-doped part, and the first active pattern and the second active pattern are disposed on a same layer.

8. The display panel of claim 7, wherein material of the first active pattern and material of the second active pattern are a same.

9. The display panel of claim 8, wherein the barrier component and the gate are disposed on a same layer.

10. The display panel of claim 9, wherein material of the barrier component and material of the gate are a same.

11. The display panel of claim 7, wherein the second electrode, the first electrode, the source, and the drain area disposed on a same layer.

12. The display panel of claim 3, wherein the display panel comprises a third electrode disposed on the passivation layer, the third electrode is connected to the source, and the connector electrode and the third electrode are disposed on a same layer.

13. The display panel of claim 12, wherein the third electrode is an anode, and material of the connector electrode and material of the anode are at least one of Cu, Ag, Li, Yb, Mg, Al, In, indium tin oxide (ITO), indium zinc oxide (IZO), or azo.

14. The display panel of claim 3, wherein the display panel comprises a fourth electrode, the fourth electrode is disposed on the planarization layer, and the connector electrode and the fourth electrode are disposed on a same layer.

15. The display panel of claim 14, wherein the fourth electrode is an anode, and material of the connector electrode and material of the anode are at least one of Cu, Ag, Li, Yb, Mg, Al, In, indium tin oxide (ITO), indium zinc oxide (IZO), or azo.

* * * * *